United States Patent [19]
Hosokawa

[11] Patent Number: 5,345,999
[45] Date of Patent: Sep. 13, 1994

[54] METHOD AND APPARATUS FOR COOLING SEMICONDUCTOR WAFERS

[75] Inventor: Akihiro Hosokawa, Cupertino, Calif.

[73] Assignee: Applied Materials, Inc., Santa Clara, Calif.

[21] Appl. No.: 32,361

[22] Filed: Mar. 17, 1993

[51] Int. Cl.⁵ ............................................. F28F 7/00
[52] U.S. Cl. ................................. 165/80.2; 118/725
[58] Field of Search ............... 165/80.2; 118/724, 725, 118/728

[56] References Cited

U.S. PATENT DOCUMENTS 4,508,161  4/1985  Holden ............................... 118/724
4,771,730  9/1988  Tezuka ............................... 118/724
4,871,687  3/1989  Prince ................................ 118/725

Primary Examiner—A. Michael Chambers
Attorney, Agent, or Firm—Michael A. Glenn

[57] ABSTRACT

A semiconductor wafer cooling pedestal has a wafer cooling surface which includes both an electrostatic chuck portion to hold the wafer securely to the pedestal during wafer cooling and a thermal transfer portion to cool the wafer. The entire wafer cooling surface of the pedestal is mirror finished to provide intimate contact between the pedestal cooling surface and the wafer, thereby providing efficient thermal transfer from the wafer to the pedestal without the need for placing a thermal transfer medium, such as Argon or other inert gas, between the wafer and the pedestal.

20 Claims, 2 Drawing Sheets

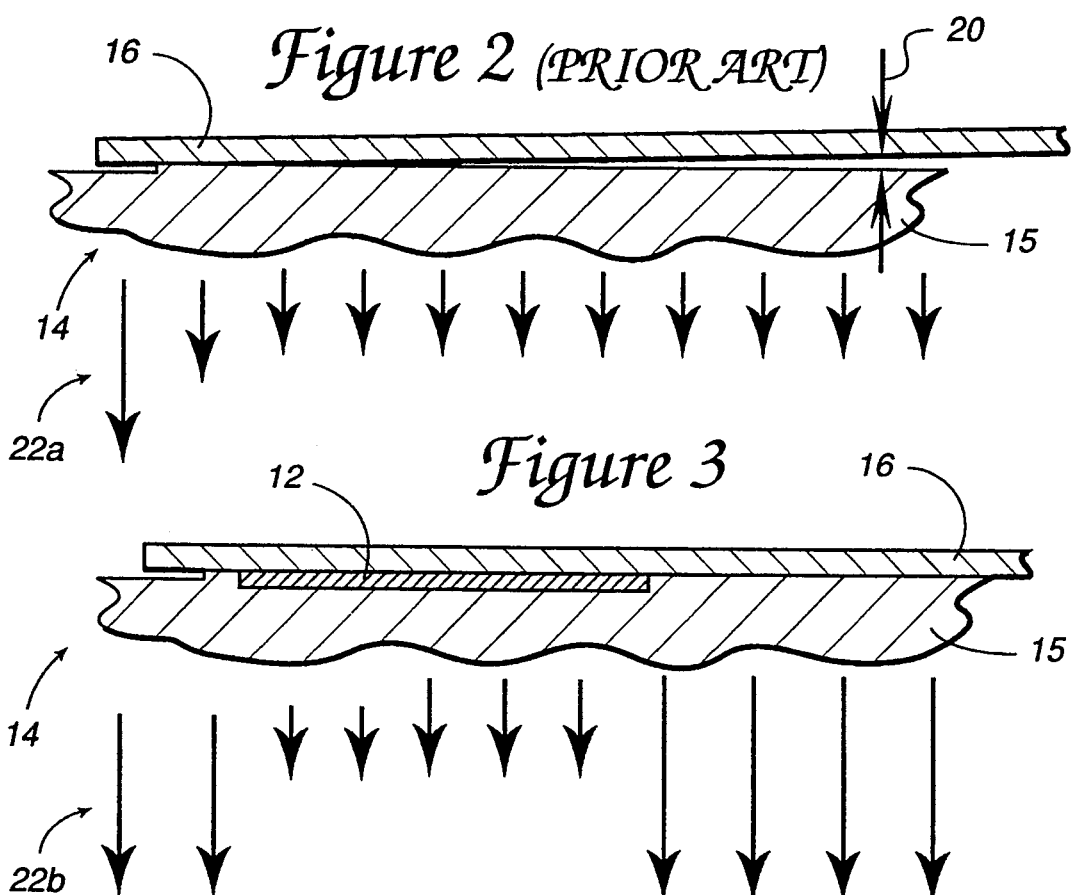
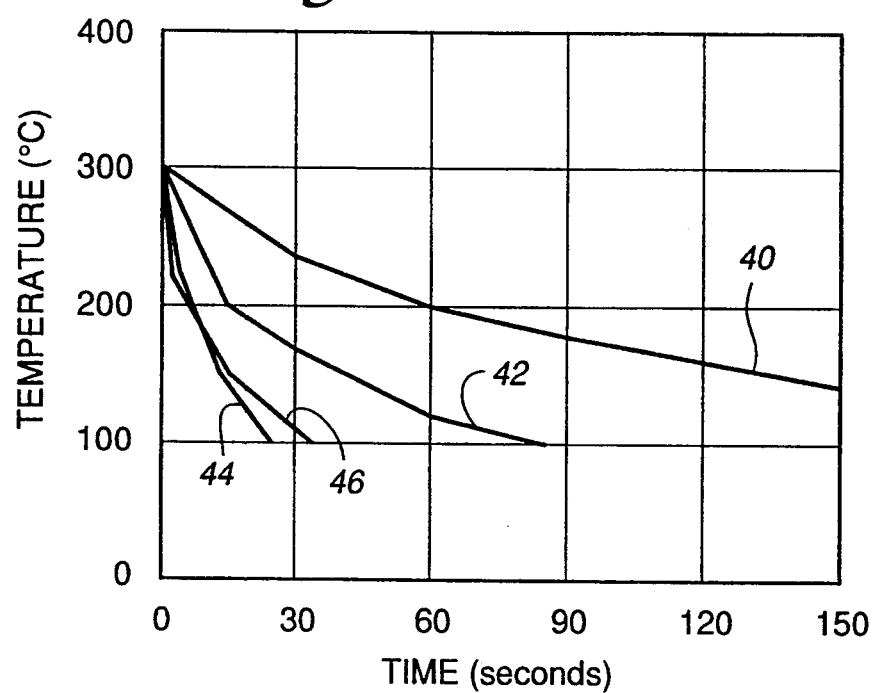

METHOD AND APPARATUS FOR COOLING SEMICONDUCTOR WAFERS

BACKGROUND OF THE INVENTION

1. Technical Field

The present invention relates to the manufacture of integrated circuits. More particularly, the present invention relates to the cooling of semiconductor wafers during the manufacture of integrated circuits.

2. Description of the Prior Art

Intense heat is often used during the various process steps that are necessary to fabricate integrated circuits on silicon wafers. It is then necessary to cool the wafers because the wafer temperature is usually in the range of 500° C. to 800° C. after such processing steps, making transport difficult (e.g. in a standard plastic wafer carrier), and limiting the ability to perform subsequent processing steps that may require lower wafer temperatures.

When the temperature of the wafer is in the 500° C. to 800° C. range, the wafer cools rapidly by radiation, i.e. by thermal transfer to the ambient. However, when the wafer has cooled such that the wafer temperature is in the 300° C. range, the rate at which the wafer cools by radiation slows considerably. The wafer cooling rate slows because the rate of cooling by radiation is proportional to the wafer temperature raised to the fourth power. That is, the amount of decrease in the rate at which the wafer cools by radiation becomes greater as the wafer temperature decreases.

It is necessary to cool a processed wafer from the 300° C. range to the 100° C. range to allow the wafer to be loaded into a standard plastic wafer handling cassette for additional processing, testing, and/or assembly. Typically, such cooling proceeds in a cooling chamber under vacuum. Current industry practice involves the following steps to accomplish such wafer cooling:

1. The processed wafer is transferred to a water cooled pedestal in a cool down chamber under vacuum to minimize exposure of the wafer to the ambient, which would otherwise contaminate the wafer.
2. The chamber pressure is increased to several bar (Torr) by introducing an inert gas, such as argon, between the processed wafer and the water cooled pedestal. The inert gas provides a thermal transfer medium that conducts heat from the wafer to the water cooled pedestal. In most applications, the inert gas is applied to a backside of the wafer to minimize the amount of pressure within the chamber. In such arrangement, the wafer is retained in position relative to the pedestal by a mechanical clamp.
3. Cooling proceeds until the wafer is cooled to about 100° C. The chamber is then pumped down to avoid increasing the base pressure of the wafer processing system and the wafer is transferred from the cooling chamber.

It is also known to use an electrostatic chuck to hold the wafer to the water cooled pedestal during wafer cooling instead of a mechanical wafer clamp. An electrostatic chuck is formed integral with the surface of the water cooled pedestal. When an electrostatic chuck is in operation, a static charge is maintained on the surface of the water cooled pedestal which attracts and holds the wafer to the surface of the pedestal during wafer cooling. U.S. Pat. No. 4,184,188, *Substrate Clamping Technique In IC Fabrication Processes*, issued to Briglia on Jan. 15, 1980 shows an electrostatic chuck of the type known in the art.

The following disadvantages are known in connection with the above approaches to wafer cooling:

1. Introducing an inert gas into the cooling chamber also introduces gas-borne particles into the chamber, which may contaminate the wafer and thus reduce the number of devices yielded by the wafer.
2. Increasing chamber pressure picks up and circulates any sediment that may have collected at the bottom and sides of the chamber, thus increasing the likelihood of wafer contamination.
3. The time required to increase chamber pressure to introduce an inert gas to assist in cooling the wafer and then pump down the chamber to remove such gas after the wafer has been cooled increases the amount of time necessary to cool the wafer and thus degrades processing throughput time.
4. The wafer clamps used to hold the wafer in place during cooling must be precision manufactured and they thus add significant manufacturing cost to that of the cooling chamber.
5. Electrostatic chucks, if used instead of wafer clamps, must include an electrically insulating layer on the entire wafer cooling surface of a pedestal between the chuck and the wafer. The insulating layer is made of ceramic materials, such as thermally conductive silicon, which are nonetheless poor thermal conductors. Thus, electrostatic chucks, while capable of holding a wafer to a water cooled pedestal, thereby obviating the need for a mechanical wafer clamp (but not eliminating the need for a thermal transfer medium, such as an inert gas), tend to inhibit heat transfer from the wafer to the water cooled pedestal and thus significantly slow the wafer cooling process. Additionally, if an electrostatic chuck is used without a thermal transfer medium, the electrostatic chuck must be very thin to achieve better thermal conductivity between the wafer and the water cooled pedetal. However, the thin ceramic insulating layer of the electrostatic chuck is easily destroyed by the high voltages used to charge the chuck and hold the wafer thereto. Thus, state of the art electrostatic chucks require frequent servicing, which adds to the down time of the cooling chamber and slows wafer processing throughput time.

It would be useful to be able to rapidly cool a processed wafer in a vacuum chamber without contaminating the wafer.

SUMMARY OF THE INVENTION

The present invention provides an improved method and apparatus for rapidly cooling a processed wafer under vacuum without contaminating the wafer.

In the preferred embodiment of the invention, a water cooled pedestal includes an upper, wafer cooling surface, a small portion of which is an electrostatic chuck formed of a ceramic material, and another, larger portion of which is a thermally conductive metal portion. Both the ceramic portion and the metal portion of the pedestal have the same profile and are finished with a precision mirror finish to alow intimate contact between the wafer and the water cooled pedestal surface, and thus provide enhanced thermal transfer from the wafer to the water cooled pedestal to expedite wafer cooling. The present invention therefore includes an electrostatic chuck which retains a wafer to the water cooled pedestal, thereby eliminating the need to incorporate a wafer clamp into the cooling chamber design. The present invention also includes a pedestal having a significant portion of the pedestal wafer cooling surface formed of a thermally conductive material, which thus allows rapid wafer cooling. The highly polished pedestal surface maximizes wafer to pedestal contact and therefore provides optimal thermal transfer from the wafer to the water cooled pedestal, obviating the need to circulate a thermal transfer medium, such as argon or other inert gases, between the wafer and the water cooled pedestal.

BRIEF DESCRIPTION OF THE DRAWINGS

FIG. 2 is a schematic diagram showing prior art wafer-to-pedestal heat transfer where wafer contour and pedestal surface mismatch occur;

FIG. 3 is a schematic diagram showing wafer-to-pedestal heat transfer according to a preferred embodiment of the present invention; and FIG. 4 is a graph showing a wafer cooling profile for prior art wafer cooling techniques and for wafer cooling in accordance with the present invention.

DETAILED DESCRIPTION OF THE INVENTION

The present invention is an improved method and apparatus for cooling wafers. The invention provides a wafer cooling pedestal having a wafer cooling surface which includes both an electrostatic chuck portion to hold the wafer to the pedestal and a thermal transfer portion to cool the wafer. The wafer cooling surface of the pedestal is mirror finished to provide intimate contact between the pedestal and the wafer, thereby obviating the need for a thermal transfer medium, such as argon or other inert gas, between the wafer and the pedestal.

Figure 1A:
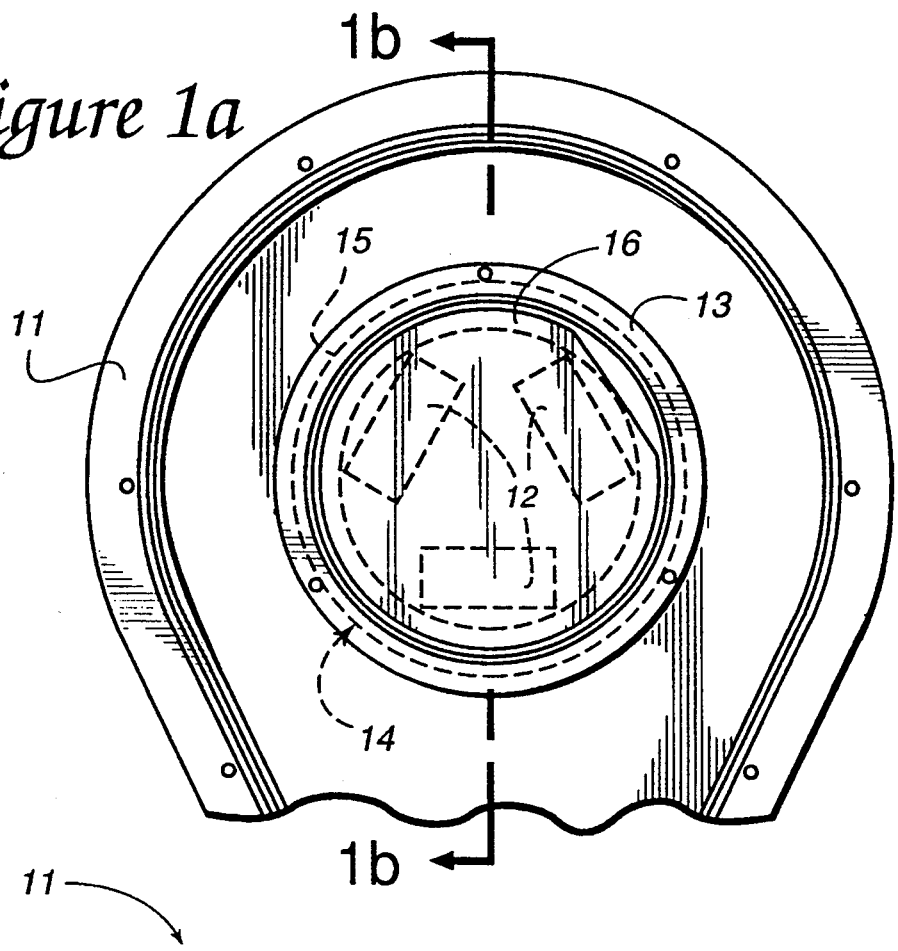
FIG. 1a is a plan view of a portion of a wafer cooling apparatus that includes an improved pedestal according to a preferred embodiment the present invention.
Figure 1B:
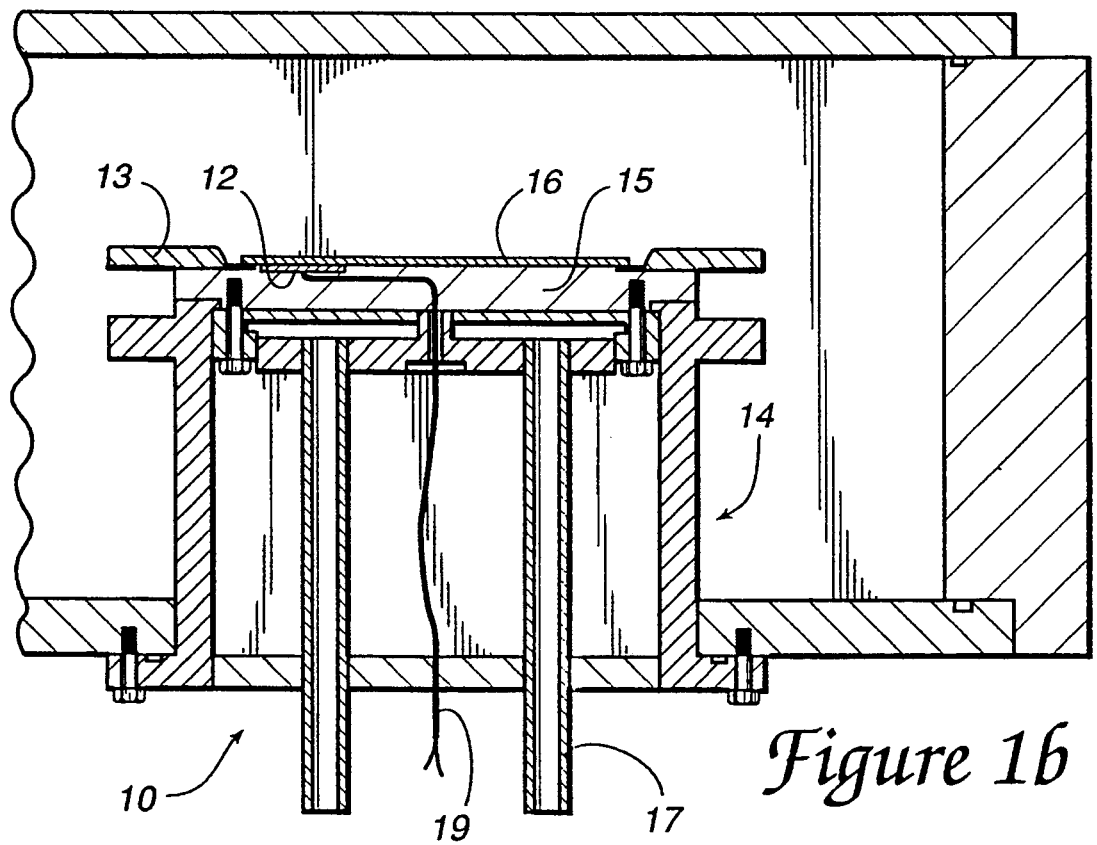
FIG. 1b is a sectional side view, taken along line 1b—1b in FIG. 1a, of a portion of a wafer cooling apparatus that includes an improved pedestal according to a preferred embodiment of the present invention.

FIG. 1a is a plan view, and FIG. 1b is a sectional side view of a portion of a wafer cooling apparatus that includes an improved pedestal according to a preferred embodiment of the present invention. During operation of the invention, a processed (and therefore "hot") wafer 16 is transferred into a cooling chamber 11. A lifter 13 in the chamber picks up the processed wafer and positions the wafer on a water cooled pedestal 14. The lifter may be of any type known in the art and it is not critical to the operation or understanding of the present invention.

The water cooled pedestal is primarily composed of the metal aluminum or alloys thereof because of its high metallic heat conductivity. It includes a cooling surface 15, a portion of which incorporates an electrostatic chuck 12 which holds the wafer to the pedestal by means of an electrostatic charge on the pedestal surface. After the processed wafer is placed on the water cooled pedestal, power is applied to the electrostatic chuck to generate the electrostatic charge that holds the processed wafer to the water cooled pedestal.

The embodiment of the invention depicted in FIG. 1a provides three separate points at which the chuck 12 holds the wafer 16 to the water cooled pedestal 14. In the figure, the electrostatic chuck 12 occupies a small portion of the total available wafer cooling surface 15 of the water cooled pedestal 14. Thus, the invention provides an electrostatic chuck which serves to secure the wafer to a cooling surface and which is configured to occupy a minimal amount of the cooling surface, such that thermal transfer is not unnecessarily inhibited by interference from the typically thermally insulating electrostatic chuck. The electrostatic chuck, by drawing the wafer to the cooling surface of the pedestal and increasing contact between the wafer and the cooling surface of the pedestal, improves thermal transfer between the wafer and the pedestal without blocking thermal transfer across a large portion of the cooling surface. Additionally, the material from which the electrostatic chuck of the present invention is formed does not have to be thermally conductive, nor does the chuck need to be thin. The present invention thus allows an electrostatic chuck that the withstand high voltages, because the insulating layer may be made from any desired material and it may be as thick as necessary to withstand such voltages without degrading thermal transfer between the wafer and the pedestal.

The present invention may be practiced with any configuration and combination of electrostatic chucks on cooling surface as required by the application to which the invention is put. A preferred embodiment of the invention is shown in FIG. 1a, in which three portions of the cooling surface 15 of the water cooled pedestal 14 are provided for electrostatic attachment to retain the wafer to the pedestal. Other embodiments of the invention may provide more or fewer points of electrostatic attachment, and such points of attachment need not be rectangular as shown in FIG. 1a, but may be round, square, triangular, annular, etc.

A power line 19 is provided for supplying electrical energy to the electrostatic chuck 12 and thereby maintain the wafer in intimate contact with the cooling surface of the water cooled pedestal as desired. That is, electrical energy is supplied to the chuck to secure the wafer to the pedestal cooling surface, and the supply of electrical energy is turned off to allow the wafer to be removed from or positioned on the pedestal wafer cooling surface. The supply of electrical current may be controlled by any of the various known means.

A water supply conduit 17 allows continuous circulation of water (or other cooling medium if desired) within the aluminum pedestal to draw heat from the pedestal as the heat is transferred to the pedestal from the processed wafer. Both the water supply conduit and the power line are located under the pedestal such that the cooling chamber may be maintained under vacuum. It will be appreciated that the pedestal of FIG. 1 is shown for purposes of example. The present invention finds ready application in any type of wafer cooling pedestal, including those pedestals that do not rely on circulation of a cooling medium within the pedestal, etc.

In the preferred embodiment of the invention, the wafer contacting surface of the electrostatic chuck is at exactly the same height as the rest of the cooling surface of the water cooled pedestal. Thus, an extremely flat surface is provided which serves to increase the actual contact area between the processed wafer and the water cooled pedestal. In addition to being coplanar, both the cooling surface of the water cooled pedestal and the wafer contacting surface of the electrostatic chuck have a mirror surface finish to further increase actual contact area between the wafer and the cooling surface of the water cooled pedestal.

FIG. 2 is a schematic diagram showing prior art wafer-to-pedestal heat transfer where wafer contour and pedestal surface mismatch occur. It is known that in most wafer cooling applications, the actual area of contact between a wafer and a pedestal is quite small, i.e. on the order of 2-3%. This surface-to-surface mismatch, and the corresponding lack of intimate contact between the wafer and the water cooled pedestal, occur because the processed wafer does have an exact flat and parallel surface relative to that of the water cooled pedestal. This is especially true after the wafer has been subjected to high temperature processing., when the wafer may be curved, warped, or bowed as shown in FIG. 2. This distortion in the planarity of the wafer creates gaps (shown as arrows 20 in FIG. 2) between the wafer 16 and the cooling surface 15 of the water cooled pedestal 14. Having such a gap between the wafer and the cooling surface of the pedestal in a vacuum chamber, where the vacuum acts as a thermal insulator, makes it very difficult to transfer heat from the wafer to the pedestal. This is why known approaches to cooling wafers use a thermal transfer medium, such as argon or other inert gas, in the gaps between the wafer and the pedestal to improve thermal transfer from the wafer to the pedestal and thus speed up the wafer cooling process.

A heat transfer profile, consisting of lines with arrows 22a, is shown in FIG. 2 in which the longer lines indicate increased thermal transfer at the point where the wafer is in intimate contact with the cooling surface of the aluminum pedestal, and in which the shorter lines indicate decreased thermal transfer where there is a gap between the wafer and the cooling surface of the pedestal.

FIG. 3 is a schematic diagram showing wafer-to-pedestal heat transfer according to a preferred embodiment of the present invention. In the figure, an electrostatic chuck 12 is used to draw the wafer to the cooling surface 15 of the pedestal 14. The electrostatic charge induced by the chuck forces the wafer to comply to the profile of the cooling surface of the pedestal and thus increases the actual contact area between the wafer and the water cooled pedestal.

The combination of the water cooled pedestal having a thermally conductive wafer cooling surface, and in which only a minimum portion of the wafer cooling surface is used to provide a point of attraction for the electrostatic chuck is very important because the electrostatic chuck, which includes a layer of a ceramic material, is not a good thermal conductor. Accordingly, the present invention exploits the advantages of the electrostatic chuck to improve wafer contact with a pedestal cooling surface, and thereby obviates the need for a thermal transfer medium. Additionally, the present invention minimizes the total surface area of the electrostatic chuck and maximizes the cooling surface, thereby providing maximum thermal transfer from the wafer to the pedestal.

A heat transfer profile, consisting of lines with arrows 22b, is shown in FIG. 3 in which the longer lines indicate increased thermal transfer at the point where the wafer is in intimate contact with the cooling surface 15 of the pedestal, and in which the shorter lines indicate decreased thermal transfer where the wafer contacts the electrostatic chuck 12.

It has been found that the advantages obtained in thermal transfer by increasing the wafer to cooling surface contact area with the use of an electrostatic chuck are enhanced if the entire wafer cooling surface of the pedestal (i.e. both the metallic cooling surface and the dielectric electrostatic chuck surfaces portions) is highly polished to a mirror finish.

FIG. 4 is a graph showing a wafer cooling profile for prior art wafer cooling techniques and for wafer cooling in accordance with the present invention. In FIG. 4, a first line 40 plots a wafer cooling curve (cooling time in seconds vs. cooling temperature in ° C.) in which a wafer is cooled, in the absence of a thermal transfer medium, on a pedestal having a precision surface finish. Such finish is described in terms of surface roughness ($R_a$), which is the average deviation of the surface above and below a hypothetical flat plane per unit of length. For purposes of the present invention, surface roughness $R_a$ shall express length in unit terms of $2.5 \times 10^{-5}$ mm ($10^{-6}$ inches). In this and in the other examples plotted on FIG. 4, known polishing techniques are used to obtain the values of surface roughness expressed in the example.

Industry practice provides a pedestal surface of about 63 $R_a$. Line 40 in FIG. 4 plots wafer cooling on a pedestal having a precision 25 $R_a$ finish. It can be seen from the figure, that for such trial, the wafer cooling speed is very slow.

A second line 44 plots a wafer cooling curve in which a wafer is cooled in the presence of a thermal transfer medium on a pedestal having a surface with a 25 $R_a$ finish. Such trial is presently the state of the art for wafer cooling. It can be seen that including a thermal transfer medium significantly improves wafer cooling speed.

A third line 42 plots a wafer cooling curve in which a wafer is cooled in the absence of a thermal transfer medium on a pedestal having a surface with a 25 $R_a$ finish and which includes an electrostatic chuck, i.e. an electrostatic chuck of the type known in which the chuck includes the entire surface of the pedestal. It can be seen that an electrostatic chuck provides some improvement over a pedestal that is used to cool a wafer in the absence a thermal transfer medium, but that the performance of this configuration is far short of that of the state of the art.

A fourth line 46 plots a wafer cooling curve in which a wafer is cooled in the absence of a thermal transfer medium on a pedestal having a surface with a 1 $R_a$ finish (i.e. mirror finish) and which includes a cooling surface, a portion of which includes an electrostatic chuck, in accordance with the present invention. It can be seen from the figure that the performance of the present invention for wafer cooling substantially approaches that of the state of the art. It is significant to note that because the present invention does not require the thermal transfer medium, such as an inert gas, which is necessary in state of the art wafer cooling techniques, the invention provides a cleaner cooling process when compared to the existing method.

Although the invention is described herein with reference to the preferred embodiment, one skilled in the art will readily appreciate that other applications may be substituted for those set forth herein without departing from the spirit and scope of the present invention. Accordingly, the invention should only be limited by the claims included below.

I claim:

1. A method for cooling a semiconductor wafer, comprising the steps of:

holding a wafer to a pedestal wafer cooling surface with an electrostatic chuck comprising at least two separate electrostatic elements that are adapted to occupy at least two discrete portions of said wafer cooling surface, and which occupies a surface area which is less than that of the wafer cooling surface.

2. The method of claim 1, wherein said wafer cooling surface has a mirror finish.

3. The method of claim 2, wherein said mirror finish is about 1 $R_a$.

4. The method of claim 2, wherein said mirror finish is less than 1 $R_a$.

5. A method for cooling a semiconductor wafer, comprising the steps of:

cooling said wafer on a pedestal having a wafer cooling surface that has a mirror finish.

6. The method of claim 5, wherein said mirror finish is about 1 $R_a$.

7. The method of claim 5, wherein said mirror finish is less than 1 $R_a$.

8. The method of claim 5, further comprising the step of:

holding a wafer to said wafer cooling surface with at least one electrostatic chuck located on a portion of said wafer cooling surface and that occupies a surface area which is less than that of the wafer cooling surface.

9. The method of claim 8, wherein the portion of said wafer cooling surface occupied by said electrostatic chuck is the minimal amount of said wafer cooling surface necessary to secure the wafer to said pedestal.

10. The method of claim 8, wherein said electrostatic chuck occupies at least two discrete portions of said wafer cooling surface for securing said wafer to said pedestal.

11. An apparatus for cooling a semiconductor wafer, comprising:

a pedestal having a wafer cooling surface; and an electrostatic chuck comprising at least two separate electrostatic elements adapted to occupy at least two discrete portions of said wafer cooling surface, and occupying a surface area which is less than that of the wafer cooling surface, for holding a wafer to said wafer cooling surface.

12. The apparatus of claim 11, wherein said wafer cooling surface has a mirror finish.

13. The apparatus of claim 12, wherein said mirror finish is about 1 $R_a$.

14. The apparatus of claim 12, wherein said mirror finish is less than 1 $R_a$.

15. An apparatus for cooling a semiconductor wafer, comprising:

a pedestal having a wafer cooling surface; and wherein said wafer cooling surface has a mirror finish.

16. The apparatus of claim 15, wherein said mirror finish is about 1 $R_a$.

17. The apparatus of claim 15, wherein said mirror finish is less than 1 $R_a$.

18. The apparatus of claim 15, further comprising:

at least one electrostatic chuck, located on a portion of said wafer cooling surface and occupying a surface area which is less than that of the wafer cooling surface, for holding a wafer to said wafer cooling surface.

19. The apparatus of claim 18, wherein the portion of said wafer cooling surface occupied by said electrostatic chuck is the minimal amount of said wafer cooling surface necessary to secure the wafer to said pedestal.

20. The apparatus of claim 18, wherein said electrostatic chuck occupies at least two discrete portions of said wafer cooling surface for securing said wafer to said pedestal.

* * * * *